United States Patent
Eberler et al.

(10) Patent No.: US 8,073,527 B2
(45) Date of Patent: Dec. 6, 2011

(54) FIELD GENERATING UNIT OF A COMBINED MR/PET SYSTEM

(75) Inventors: Ludwig Eberler, Postbauer-Heng (DE); Razvan Lazar, Erlangen (DE); Jürgen Nistler, Erlangen (DE); Wolfgang Renz, Erlangen (DE); Norbert Rietsch, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 1103 days.

(21) Appl. No.: 11/905,250

(22) Filed: Sep. 28, 2007

(65) Prior Publication Data

US 2008/0088309 A1 Apr. 17, 2008

(30) Foreign Application Priority Data

Sep. 29, 2006 (DE) .................. 10 2006 046 287

(51) Int. Cl.
*A61B 5/05* (2006.01)

(52) U.S. Cl. ........ 600/411; 5/601; 250/363.03; 600/436

(58) Field of Classification Search .................. 600/410, 600/411, 415, 436; 324/300, 318, 322; 250/363.03; 343/700 R; 5/601
See application file for complete search history.

(56) References Cited

U.S. PATENT DOCUMENTS

| | | | |
|---|---|---|---|
| 5,850,143 A | 12/1998 | Schubert et al. | |
| 6,943,552 B2 | 9/2005 | Renz | |
| 7,148,688 B2 | 12/2006 | Kojima | |
| 7,394,253 B2 | 7/2008 | Okamoto et al. | |
| 2002/0021128 A1 | 2/2002 | Kuhara | |
| 2006/0047198 A1 | 3/2006 | Sugimoto | |
| 2006/0267586 A1 | 11/2006 | Okamoto et al. | |
| 2010/0244838 A1 | 9/2010 | Okamoto et al. | |

FOREIGN PATENT DOCUMENTS

| | | |
|---|---|---|
| CN | 1670517 A | 9/2005 |
| CN | 1742675 A | 3/2006 |

(Continued)

OTHER PUBLICATIONS

D. Schlyer et al. "Development of a Simultaneous PET/MRI Scanner", Nuclear Science Symposium Conference Record 2004, Oct. 16-22, 2004, vol. 4, 3419-3421; D. Schlyer et al. "Development of a Simultaneous PET/MRI Scanner", Nuclear Science Symposium Conference Record 2004, Oct. 16-22, 2004, vol. 4, 3419-3421; D. Schlyer et al. "Development of a Simultaneous PET/MRI Scanner", Nuclear Science Symposium Conference Record 2004, Oct. 16-22, 2004, vol. 4, 3419-3421; Magazine; 2004.
German Office Action dated Jan. 31, 2008.

(Continued)

*Primary Examiner* — Parikha Mehta
(74) *Attorney, Agent, or Firm* — Harness, Dickey & Pierces, P.L.C.

(57) ABSTRACT

An RF antenna arrangement of a combined MR/PET system is disclosed. In at least one embodiment, the RF antenna arrangement includes a first part installed in the examination tunnel in a fashion fixed to the system such that it is arranged underneath the couch board when the latter is introduced, and a second part, which can be placed onto the couch board and be introduced into and withdrawn from the examination tunnel together with the couch board. In at least one embodiment, the second part is of dimensionally stable design and has a clear cross section that is adapted to the object to be examined. Consequently, the time outlay for applying the RF antenna is reduced, and the fixed position of the RF antenna enables a correction of the attenuation of gamma rays. Furthermore, a number of second parts having various diameters can be provided.

12 Claims, 3 Drawing Sheets

FOREIGN PATENT DOCUMENTS

| | | |
|---|---|---|
| CN | 1817304 A | 8/2006 |
| DE | 19615184 A1 | 10/1997 |
| DE | 19741748 A1 | 12/1998 |
| DE | 103 18 190 | 11/2004 |
| JP | 2006141444 A | 6/2006 |
| WO | WO 2005076027 A1 | 8/2005 |
| WO | WO 2006071922 A2 | 7/2006 |

OTHER PUBLICATIONS

Klass P. Pruessmann et al.: "SENSE: Sensitivity Encoding for Fast MRI", Magnetic Resonance in Medicine 42:952-962, @ 1999 Wiley-Liss, Inc.

Chinese Office Action dated Nov. 12, 2010 in corresponding Chinese Application No. 200710152891.2, with English translation.

Chinese Office Action dated Apr. 22, 2010 in corresponding Chinese Application No. 200710152891.2 and English translation thereof.

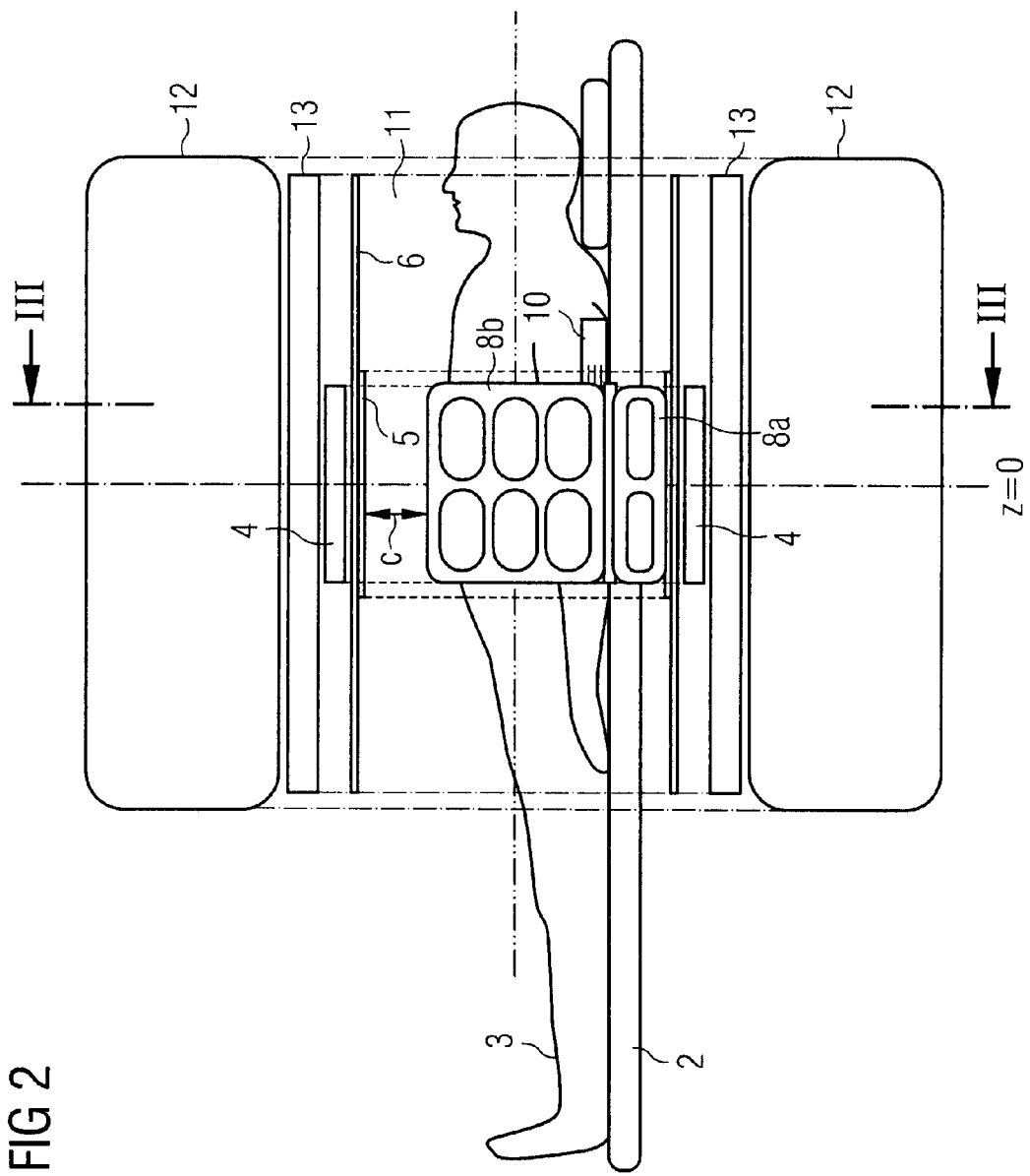

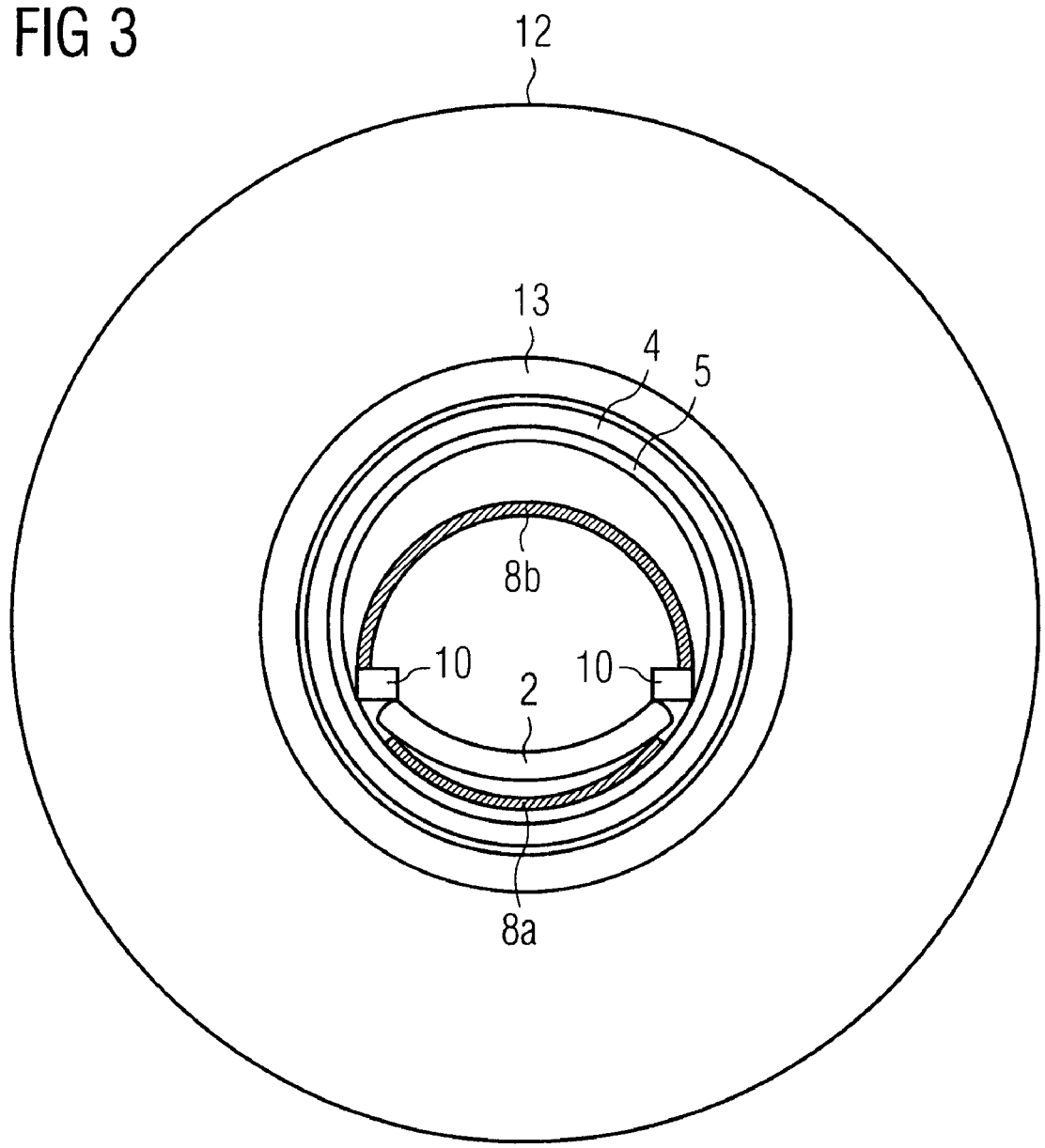

FIELD GENERATING UNIT OF A COMBINED MR/PET SYSTEM

PRIORITY STATEMENT

The present application hereby claims priority under 35 U.S.C. §119 on German patent application number DE 10 2006 046 287.4 filed Sep. 29, 2006, the entire contents of which is hereby incorporated herein by reference.

FIELD

Embodiments of the invention generally relate to a combination of medical imaging methods of MR or MRT (magnetic resonance tomography) and PET (positron emission tomography) in one device. For example, in at least one embodiment it may relate to a field generating unit of a combined MR/PET system having a main magnet for generating a constant magnetic field in an examination tunnel, and a PET detector ring radially surrounding the examination tunnel. The object to be examined can be introduced on a displaceable couch board into the examination tunnel.

BACKGROUND

Magnetic resonance tomography (MR or MRT) is an imaging method for displaying tissue in the human or animal body. MRT is based on the principle of nuclear magnetic resonance in accordance with which atomic nuclei such as the hydrogen nuclei present in large numbers in the body exhibit a magnetic moment. Consequently, they can be excited in an applied external magnetic field with the aid of electromagnetic radiation in the radio frequency range (termed RF radiation or RF pulse), and output this radiation shortly thereafter. This RF radiation, also termed an MR signal, is detected with the aid of an RF antenna that can also be used to generate the exciting radiation. The external magnetic field is mostly generated by a superconducting main magnet that encloses a horizontal examination tunnel into which the object to be examined, for example a patient on a couch board, is pushed. Spatial coding of the MR signals can be achieved by magnetic fields having a spatial gradient that are generated by so-called gradient coils.

The unit surrounding the examination tunnel and composed of main magnet, gradient coils and, if appropriate, an RF antenna is designated in general as a "field generating unit". Further components of an MR system such as control computer, ADCs, frequency generators etc are not part of the field generating unit, but are generally arranged next to the field generating unit in a separate room.

A further medical imaging method is positron emission tomography (PET). PET is particularly suitable as a nuclear medicine method for displaying biochemical processes in the body, for example for finding tumors and metastases. The patient is in this case administered a tracer with a radionuclide that is distributed in the body and outputs radioactive radiation in the process in the form of positrons. After a short time, the positrons decay into two gamma quanta that move in opposite spatial directions and are captured by suitable detectors. The latter are mostly arranged around the body as an annular PET detector. For example, the gamma radiation is captured by a matrix composed of scintillation crystals in which a strike by any photon produces a scintillation. The latter is, in turn, captured and amplified by photodetectors, for example by avalanche photodiodes.

There has recently been interest in combining MRT and PET with each other in one device, to allow both imaging modalities to be used simultaneously or one after the other in the same body part of the patient (as far as possible with the same image field). For this, a PET detector ring is also integrated into the field generating unit.

Instead of the RF antenna integrated in the field generating unit, which is also termed a whole body antenna, use is often also made of so-called local coils in order to improve the signal-to-noise ratio in the MRT. The local coils are RF antennas that are adapted to specific body parts and, after the patient has been supported on the couch board, but still outside the field generating unit, are laid by the operating staff directly on the body part to be examined. Often, the RF pulses are then still generated by the whole body antenna, while the body coil functions as receiving coil and receives the MR signals. It is thereby possible to achieve a substantially better image quality in comparison with reception with the aid of the whole body antenna installed fixedly in the field generating unit.

However, the use of local coils exhibits various disadvantages in the case of a combined MR/PET system: firstly, in order to apply the local coils, the operating staff require a time of up to five minutes per patient for positioning and later removing the local coils. By contrast with the patient examinations on PET devices currently in use, the operating staff are thereby exposed to a radiation burden lasting for a longer time period.

Moreover, the structure of the interior local coil reduces the sensitivity of the PET detector ring and requires a correction. However, a correction is scarcely possible in the case of PET image reconstruction owing to the variable spatial arrangement of the local coils as a function of the body shape of the patient to be examined.

DE 103 18 190 A1 describes an antenna arrangement for a pure MR device that is intended to replace the conventional local coils laid directly on the body. This arrangement is of lesser diameter than the whole body coil, but permanently integrated in the examination tunnel. For example, it is intended to be held with an accurate fit in the examination tunnel. The installation and dismantling of the antenna arrangement is therefore very laborious in the case of DE 103 18 190 A1, since an operator must lean from one side into the field generating unit in order to insert or remove the antenna arrangement. It is therefore not feasible to adapt to changing patient diameters.

SUMMARY

In at least one embodiment of the invention, an RF antenna arrangement is provided that is specifically improved or even optimized for a combined MR/PET system, does not exhibit at least one of the above disadvantages of conventional body coils, and/or supplies a signal-to-noise ratio comparable to these coils.

Consequently, at least one embodiment of the invention provides a field generating unit having an internal RF antenna arrangement that is suitable at least for receiving MR signals and has a first part, which is installed in the examination tunnel in a fashion fixed to the system such that it is arranged underneath the couch board when the latter is introduced, and a second part, which can be placed onto the couch board and be introduced into and withdrawn from the examination tunnel together with the couch board, the second part of the internal RF antenna arrangement being of dimensionally stable design and having a clear cross section that is adapted to the cross section of the object to be examined.

A couch board is taken to mean the movable part of the couch on which the object to be examined, for example a patient, is typically supported, and on which the latter is moved into the examination tunnel.

In the case of at least one embodiment of the invention, the internal RF antenna arrangement takes over the task of the local coils in accordance with the prior art. By virtue of the fact that the arrangement is dimensionally stable, it always exhibits the same attenuation pattern for gamma rays when it is inserted for an imaging examination into the center (Z=0) of the examination tunnel. Consequently, the attenuation can easily be corrected. Complicated measures for detecting and correcting structures lying within the PET detector ring (attenuation correction) are eliminated. This saves examination time and computer time when reconstructing images. Furthermore, because of the fixed position of the internal RF antenna arrangement optimizing to the least possible attenuation of the gamma radiation is easier and more efficient to implement. Consequently, it is possible to implement an arrangement with relatively low attenuation and without large inhomogeneities in the attenuation.

A further advantage lies in the time saved by the operating staff. Since the second (upper) part of the internal RF antenna arrangement is of dimensionally stable design, it can be placed on the couch board within a very short time after an object or patient to be examined has been supported thereon. The time required for this is typically under 0.5 minutes. The radiation burden on the operating staff is thereby reduced.

Finally, by comparison with the reception of the MR signals with the aid of a whole body antenna (the external RF antenna arrangement), the image quality is substantially improved. This is achieved by virtue of the fact that the second part of the internal RF antenna arrangement is adapted to the cross section of the object to be examined, that is to say is very much less than the cross section of the entire examination tunnel in the case of a normal, slim patient.

The first (lower) part of the RF antenna arrangement typically remains in the examination tunnel, while the second (upper) part can be inserted and withdrawn into and from the examination tunnel with the patient base. By comparison with the arrangement of DE 103 18 190 A1, this greatly facilitates exchanging the internal RF antenna arrangement. Specifically, in the case of the publication named the entire internal RF antenna arrangement, which can also include two parts, is permanently inserted into the examination tunnel. It is not envisaged to take it out with the aid of the movable couch board.

In accordance with an example embodiment, the examination tunnel has an accommodating device with the aid of which the second part of the internal RF antenna arrangement in the field generating unit can be held in a fashion fixed to the system while the couch board is pushed through the examination tunnel. The background to this is as follows: in the case of a combined MR/PET examination, it is not infrequently intended to examine the entire body, for example for metastases. This is best achieved by moving the patient through the antenna arrangement and/or the PET detector ring during the MR examination and the PET examination. This can be achieved by pushing the couch board through the examination tunnel in a piecewise fashion. Consequently, it has been possible to date to conduct the MR examination only by using the whole body antenna installed in a fashion fixed to the system.

However, the inventive internal RF antenna arrangement of at least one embodiment is also suitable for this purpose when it is configured in accordance with the example embodiment such that although the second (upper) part is introduced with the aid of the couch board it can, however, be retained in the center of the examination tunnel. This can be achieved, for example, by a pin connection with the accommodating device. It is then preferred to arrange on both sides of the couch board corresponding rails onto which the second part of the internal RF antenna arrangement is placed in such a way that it can slide over the rails. In any case, the first (lower) part is arranged in the examination tunnel in a fashion fixed to the system but, if appropriate, capable of being removed. A connection between the first and second parts can be made via the guide rails or via the accommodating device for the second part.

In accordance with an example embodiment, the accommodating device has specifically electrical contacts also for connecting the second part of the internal RF antenna arrangement to a control unit arranged outside the field generating unit. Such a control unit generates RF pulses, if appropriate, and receives and amplifies the MR signals captured by the antenna arrangement. Owing to the fact that the electrical contacts for the control unit are arranged in the accommodating device, further time is saved in applying the coil. In the case of the conventional local coils, the operator must, specifically, insert the connecting cable of the local coil manually into a bushing on the field generating unit after the coil is applied. This manipulation is now eliminated, since the electrical contact is automatically produced after the second part of the internal RF antenna arrangement has been pushed into the examination tunnel. A further advantage of this embodiment resides in the fact that no electrical leads are guided through the image field of the PET detector ring. This also reduces the need for corrections.

In at least one example embodiment, the accommodating device is suitable for holding the second part of the internal RF antenna arrangement in the field generating unit in a fashion fixed to the system while the couch board is withdrawn from the examination tunnel and the object to be examined is exchanged. There are thus two possibilities as regards the manipulation of the internal RF antenna arrangement: firstly, the entire antenna can remain in the examination tunnel and be reused with a subsequent object or subsequent patient. This is particularly apt when the next patient has approximately the same cross-sectional measurements as the first patient. The size of the patient can be checked either after being estimated by the operating staff (visual estimate), or a dummy antenna arrangement can be used to monitor size. Moreover, it is possible to move the second part of the internal RF antenna arrangement out together with the patient and the couch board, and to have the operating staff remove it from the outside. The same or another second part of the internal RF antenna arrangement is selected for the next patient as a function of the cross-sectional size (the thickness) of the patient, and is placed onto the couch board as described above.

As already mentioned, the object to be examined can be a human or an animal. The invention is not restricted only to combined MR/PET systems for hospitals, but can also be used in the case of research facilities, in particular with specialized field generating units for examining animals.

The size and/or the shape of the clear cross section of the second part of the internal RF antenna arrangement is preferably adapted to the cross-sectional size and/or cross-sectional shape of the object to be examined. In this case, the internal RF antenna arrangement is to be arranged as close as possible to the object in order to optimize the signal-to-noise ratio. At the same time, upon displacement of the couch board, the object or the patient is, however, intended to be able to slide through under the second part of the RF antenna arrangement. The second part is thus typically in the shape of an arc. The arc can be flat, high or pointed in various embodiments.

It is particularly preferred to provide in conjunction with an unchanged first (lower) part of the internal RF antenna arrangement a number of various second parts having different clear cross-sectional sizes and/or clear cross-sectional shapes.

The internal RF antenna arrangement can include a birdcage antenna or a multichannel receiving coil, also termed an array coil. This enables the parallel acquisition of MR signals with the aid of a number of channels, which leads to a further improvement in the signal-to-noise ratio. It is possible to apply parallel reception techniques such as SENSE (SENSitivity Encoding—see, for example, Klass P. Pruessmann et al.: "SENSE: Sensitivity Encoding for Fast MRI" Magnetic Resonance in Medicine, 42:952-62, 1999) or GRAPPA (GeneRalised Autocalibrating Partially Parallel Acquisitions), the entire contents of each of which are hereby incorporated herein by reference.

If, for the purpose of examination, the second part of the internal RF antenna arrangement is pushed approximately into the center (Z=0) of the examination tunnel, the image field of the internal RF antenna arrangement and the image field of the PET detector ring should overlap at least in substantial parts. It is thereby possible to record MR and PET image data of one and the same body part simultaneously as the couch board with the patient is pushed through the two image fields in piecewise or continuous fashion.

Aside from the conductor tracks, an RF antenna arrangement for an MR device typically has yet further electronic components, for example a detuning element, a preamplifier and, of course, electrical supply leads. In order not to attenuate the gamma radiation unnecessarily during imaging, these components of the internal RF antenna arrangement are preferably arranged outside the image field of the PET detector ring. This can be implemented, for example, by integrating these components in the accommodating device that, for its part, is arranged just outside the image field of the PET detector ring.

In order further to reduce the attenuation of the gamma rays, the section of the internal RF antenna arrangement necessarily located in the image field of the PET detector ring during the examination is preferably configured such that the arrangement is improved or even optimized for the least possible attenuation of the gamma ray path. As mentioned above, for one thing as far as possible it is only conductor tracks that are located in the image field of the PET detector ring. These are constructed from metal layers that are as thin as possible, in particular metal layers approximately 5 to 30 μm thick, particularly preferably a copper layer 18 μm thick. The conductor tracks are applied to a cladding that preferably includes plastic and is likewise fabricated as thinly as possible.

As mentioned above, a set of a number of second parts of the internal RF antenna arrangement is preferably made available, in which the number of second parts have various clear cross-sectional sizes and/or cross-sectional shapes.

At least one embodiment of the invention is also directed to an MR/PET system having a field generating unit as described above and a set of a number of second parts of the internal RF antenna arrangement. The MR/PET system has a control unit for the internal RF antenna arrangement and an arithmetic logic unit for reconstructing three-dimensional PET images from image data acquired by the PET detector ring. In this case, the control unit automatically detects during operation which second part of the internal RF antenna arrangement of the set is held in the accommodating device, and outputs a corresponding signal to the arithmetic logic unit. This can therefore correct the attenuation of the gamma rays produced during the image reconstruction by this second part of the internal RF antenna arrangement. For each second part of the set, the requisite correction was therefore determined once with regard to the attenuation of the gamma rays. When the MR/PET system automatically detects which internal RF antenna arrangement is currently being used, the correction can easily be carried out during the PET image reconstruction.

BRIEF DESCRIPTION OF THE DRAWINGS

The invention will now be explained in more detail with the aid of example embodiments and with reference to the attached drawings, in which:

FIG. 2 shows a longitudinal sectional through the field generating unit of FIG. 1, with couch board moved into the examination tunnel; and FIG. 3 shows a cross section through the field generating unit of FIG. 2 along the line III-III, without patient.

DETAILED DESCRIPTION OF THE EXAMPLE EMBODIMENTS

Figure 1:
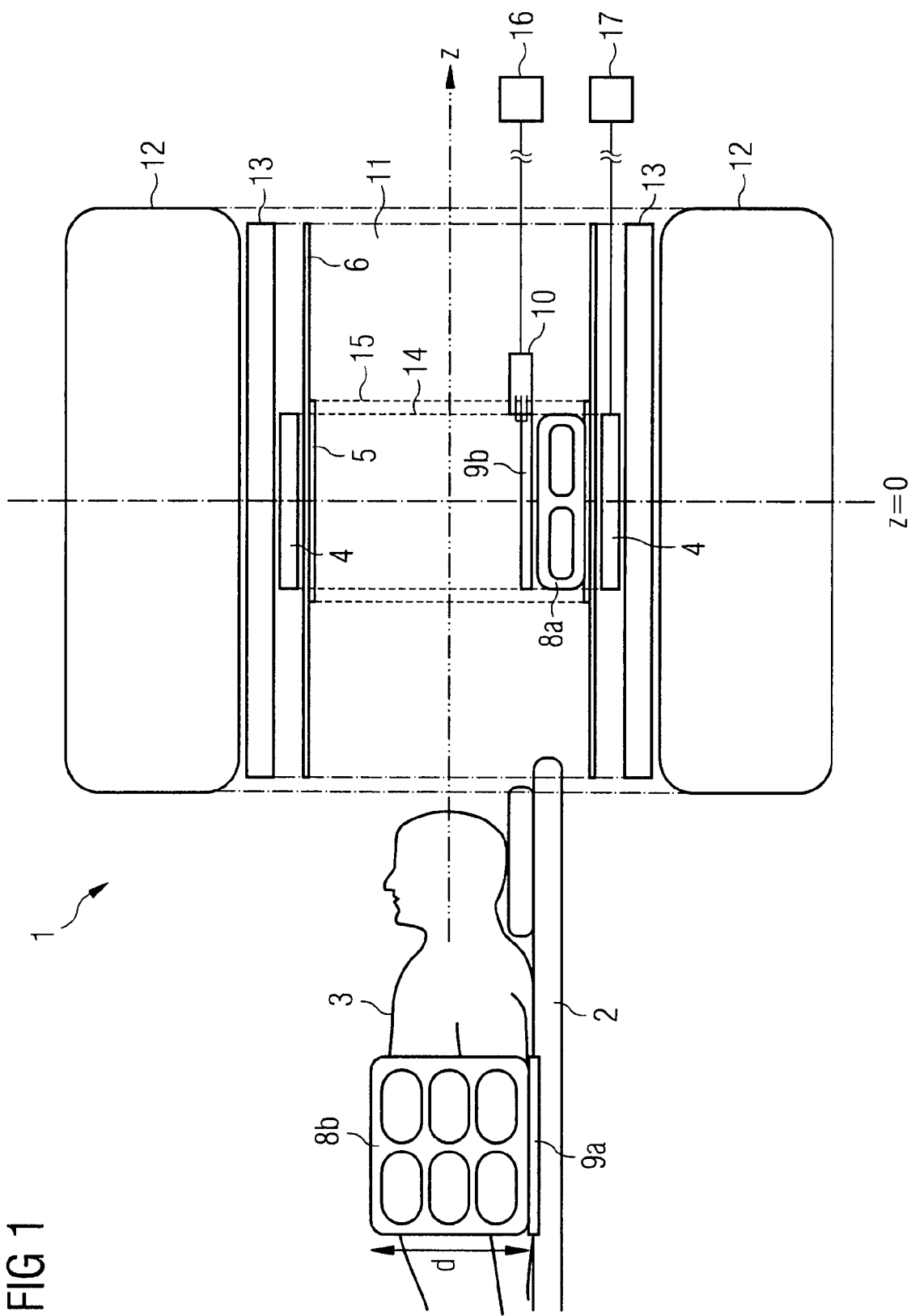
FIG. 1 shows a partial longitudinal section through a field generating unit with couch board moved out, in accordance with one embodiment of the invention.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1 illustrates a field generating unit 1 in longitudinal section through the Z-axis (depicted with double dots). A substantially homogeneous magnetic field prevails in the Z direction in the middle of the examination tunnel 11 at Z=0, and so it is here that the MR imaging is carried out.

The gradient fields are generated by the gradient coils 13. The PET detector ring 4 is arranged centered, further inward radially, likewise around Z=0. Following further inward is a support tube 6 for the external RF antenna arrangement or whole body antenna 5. Such a whole body antenna 5 is readily used for overview pictures and as transmitting antenna. The image field 14 of the PET detector ring and the image field 15 of the whole body antenna 5 overlap one another as far as possible.

The field generating unit 1 further includes the lower part 8a of an internal RF antenna arrangement 8. The part 8a is arranged such that it is arranged under the couch board 2 when the latter is introduced.

However, the couch board 2 is moved out in the illustration of FIG. 1. A patient 3 is supported on the couch board, and a second (upper) part 8b of the internal RF antenna arrangement is placed over the trunk of the patient 3. The part 8b is not shown in cross section. As is to be seen from the drawing, the clear height d of the second part 8b is slightly higher than the maximum height of the supported patient 3 such that the latter can still slide through under the second part 8b.

The second part 8b of the internal RF antenna arrangement is placed onto a rail 9a of the patient base. When the couch board 2 is pushed into the examination tunnel 11, this makes contact with a corresponding rail 9b that is connected to an accommodating device 10. The electrical contacts are arranged in the accommodating device 10. Moreover, this preferably has a pin (not illustrated) that, upon the couch board 2 being pushed in, automatically engages in a corresponding cutout in the second part 8b of the RF antenna arrangement, and thereby retains this in the center of the examination tunnel 11, even if the couch board 2 is moved further. The pin connection, however, can also be released in order to move the second part 8b of the RF antenna arrangement out of the examination tunnel 11.

The accommodating device 10 or the electrical contacts thereof are connected to a control unit 16 for the RF antenna arrangement. This also preferably controls the first (lower) part 8a of the internal RF antenna arrangement. The PET detector ring 4 is electrically connected to an arithmetic logic unit 17 that processes the signals from the PET detector ring and reconstructs the image data. The components 16 and 17 are not part of the field generating unit 1, and are preferably magnetically shielded therefrom, for example accommodated in a shielded neighboring room.

In accordance with the drawing, the internal RF antenna arrangement 8a, 8b is an array coil. However, design as a birdcage antenna is also possible. The internal RF antenna arrangement preferably functions only as a receiving coil, the RF pulses being transmitted by the whole body antenna 5. However, it is also possible to have embodiments in which the internal RF antenna arrangement 8a, 8b functions both as transmitting antenna and as receiving antenna. In these embodiments, the whole body antenna 5 can be dispensed with entirely.

FIG. 2 illustrates the arrangement of FIG. 1 with couch board 2 introduced. The couch board is pushed so far into the examination tunnel 11 here that the second part 8b of the internal RF antenna arrangement is arranged directly over the first part 8a, and is thus located approximately in the center (Z=0) of the examination tunnel 11. In this case, an electrical contact of the second part 8b is automatically established with the accommodating device 10 such that the second part 8b is also connected to the control unit 16 for the RF antenna arrangement.

A clearance c is left between the uppermost part of the second part 8b of the internal RF antenna arrangement and the ceiling of the examination tunnel 11. This clearance c shows that the second RF antenna arrangement 8a, 8b is arranged substantially closer to the body of the patient 3 than a whole body antenna 5.

To carry out an imaging examination, the couch board 2 can be pushed in a piecewise fashion through the internal RF antenna arrangement 8a, 8b, which is held by the accommodating device 10. In each new position, MR image data are acquired with the aid of the internal RF antenna arrangement 8a, 8b, and PET image data are acquired with the aid of the PET detector ring 4 and are reconstructed to form three-dimensional image data. During reconstruction of the PET image data, the known shape and position of the RF antenna arrangement 8a, 8b are used to correct the attenuation of the gamma rays.

Alternatively, the couch board 2 can also be pushed continuously through the stationary internal RF antenna arrangement 8a, 8b while MR image data and PET image data are acquired continuously ("move during scan").

The arrangement of FIG. 2 is to be seen in cross section in FIG. 3. Identical parts are marked here in turn with the same reference numerals. The arcuate shape of the second part 8b of the internal RF antenna arrangement is particularly visible in FIG. 3, as is the position of two accommodating devices 10 on both sides of the couch board 2. When the second part 8b is pushed in, it automatically engages in the accommodating devices 10 and makes both mechanical and electrical contact therewith. The first (lower) part of the internal RF antenna arrangement 8a is arranged underneath the couch board 2 in a fashion fixed to the system.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A field generating unit of a combined MR/PET system, the field generating unit surrounding an examination tunnel, wherein a displaceable couch board is configured to be introduced into and withdrawn from the examination tunnel, and the displaceable couch board is further configured to hold an object to be examined, the field generating unit comprising:
   a main magnet configured to generate a constant magnetic field in the examination tunnel;
   a PET detector ring radially surrounding the examination tunnel, the PET detector ring being configured to detect gamma rays;
   an internal RF antenna arrangement configured to receive MR signals, the internal RF antenna including a first part installed in the examination tunnel and arranged underneath the couch board when the couch board is introduced into the examination tunnel, and including a second part configured to be placed onto the couch board and introduced into and withdrawn from the examination tunnel together with the couch board, the second part of the internal RF antenna arrangement including a cross section adapted to a cross section of the object to be examined, and an accommodating device in the examination tunnel, the accommodating device being configured to hold the second part of the internal RF antenna arrangement in the field generating unit while the couch board is pushed through the examination tunnel.

2. The field generating unit as claimed in claim 1, further comprising:

an external RF antenna arrangement surrounding the examination tunnel, the external RF antenna arrangement being configured to transmit RF pulses and receive MR signals.

3. The field generating unit as claimed in claim 2, wherein an image field of the internal RF antenna arrangement and an image field of the PET detector ring overlap.

4. The field generating unit as claimed in claim 1, wherein the accommodating device includes electrical contacts configured to connect the second part of the internal RF antenna arrangement to a control unit arranged outside the field generating unit.

5. The field generating unit as claimed in claim 1, wherein the accommodating device is configured to hold the second part of the internal RF antenna arrangement in the field generating unit while the couch board is withdrawn from the examination tunnel and the object to be examined is exchanged.

6. The field generating unit as claimed in claim 1, wherein the displaceable couch board is configured to hold a human or animal as the object to be examined.

7. The field generating unit as claimed in claim 1, wherein at least one of a shape and size of the cross-section of the second part of the internal RF antenna arrangement is adapted to at least one of a shape and size of the cross-section of the object to be examined such that the internal RF antenna arrangement is arranged as close as possible to the object but, upon displacement of the couch board, the object is configured to slide under the second part, held by the accommodating device, of the internal RF antenna arrangement.

8. The field generating unit as claimed in claim 1, wherein the internal RF antenna arrangement includes at least one of a birdcage antenna and a multichannel receiving coil.

9. The field generating unit as claimed in claim 1, wherein an image field of the internal RF antenna arrangement and an image field of the PET detector ring overlap.

10. The field generating unit as claimed in claim 1, wherein the combined MR/PET system is configured to acquire MR and PET image data of an entire body of a human by pushing the couch board piecewise through an image field of the internal RF antenna arrangement and through an image field of the PET detector ring.

11. The field generating unit as claimed in claim 1, wherein the internal RF antenna arrangement includes at least one of a detuning element, a preamplifier and an electrical supply lead, arranged outside the image field of the PET detector ring.

12. An MR/PET system comprising:

a field generating unit and a set of a number of different second parts of an internal RF antenna arrangement, the field generating unit surrounding an examination tunnel, wherein a displaceable couch board is configured to be introduced into and withdrawn from the examination tunnel, and the displaceable couch board is configured to hold an object to be examined, the field generating unit including, a main magnet configured to generate a constant magnetic field in the examination tunnel, a PET detector ring radially surrounding the examination tunnel, the PET detector ring being configured to detect gamma rays, an internal RF antenna arrangement configured to receive MR signals, the internal RF antenna arrangement including a first part installed in the examination tunnel and arranged underneath the couch board when the couch board is introduced into the examination tunnel, and including a particular second part from among the set of the number of different second parts, the particular second part being configured to be placed onto the couch board and introduced into and withdrawn from the examination tunnel together with the couch board, the particular second part of the internal RF antenna arrangement including a cross section adapted to a cross section of the object to be examined, and an accommodating device in the examination tunnel, the accommodating device being configured to hold the particular second part of the internal RF antenna arrangement in the field generating unit while the couch board is pushed through the examination tunnel;

a control unit for the internal RF antenna arrangement; and an arithmetic logic unit configured to reconstruct three-dimensional PET images from image data acquired by the PET detector ring; wherein the control unit is configured to automatically detect, during operation, which one of the second parts of the internal RF antenna arrangement of the set is held in the accommodating device, and to output a corresponding signal to the arithmetic logic unit, and the arithmetic logic unit is configured to correct, during the image reconstruction, the attenuation of the gamma rays produced by the particular second part of the internal RF antenna arrangement.

* * * * *